US006781534B2

(12) United States Patent
Karlquist

(10) Patent No.: US 6,781,534 B2
(45) Date of Patent: Aug. 24, 2004

(54) SYSTEM AND METHOD FOR DIVISOR THRESHOLD CONTROL IN A MODULATION DOMAIN DIVIDER

(75) Inventor: Richard K. Karlquist, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/732,339

(22) Filed: Dec. 10, 2003

(65) Prior Publication Data

US 2004/0119624 A1 Jun. 24, 2004

Related U.S. Application Data

(63) Continuation-in-part of application No. 10/328,304, filed on Dec. 23, 2002.

(51) Int. Cl.[7] .................................................. H03M 3/00

(52) U.S. Cl. ........................................ 341/143; 341/155

(58) Field of Search ................................. 341/143, 155; 342/433, 200; 332/145; 714/792; 375/271

(56) References Cited

U.S. PATENT DOCUMENTS

| | | | |
|---|---|---|---|
| 3,872,477 | A | 3/1975 | King |
| 4,229,715 | A | 10/1980 | Henry |
| 4,433,312 | A | 2/1984 | Kahn |
| 5,862,155 | A | 1/1999 | Lomp et al. |
| 5,995,552 | A | 11/1999 | Moriyama |
| 6,057,798 | A | 5/2000 | Burrier et al. |

OTHER PUBLICATIONS

U.S. patent application Ser. No. 10/328,298, Karlquist, filed Dec. 23, 2002.

U.S. patent application Ser. No. 10/328,358, Karlquist, filed Dec. 23, 2002.

U.S. patent application Ser. No. 10/328,363, Karlquist, filed Dec. 23, 2002.

Armstrong, Edwin H, "A Method of Reducing Disturbances in Radio Signaling by a System of Frequency Modulation," Proc. IRE, vol. 24, No. 5, ay 1936, p. 689ff.

Jaffe, D.L., "Armstrong's Frequency Modulator," Proc. IRE, vol. 26, No. 4, Apr. 1938, p. 475ff.

*Primary Examiner*—Jean Bruner Jeanglaude

(57) ABSTRACT

A modulation domain divider is disclosed that causes the divider output to be attenuated when the divisor input falls below the divisor threshold. Attenuation is accomplished by implementing the divider in the modulation domain and substituting an unmodulated signal for the normal modulated signal when the divisor is below the threshold value.

33 Claims, 8 Drawing Sheets n(t)<<d(t)→sin n(t)/d(t) ~ n(t)/d(t)
n(t)<<d(t)→cos n(t)/d(t) ~ 1
→ d(t){cos ωt-[n(t)/d(t)] sin ωt}
~d(t){cos ωt cos n(t)/d(t)]+sin ωt sin [n(t)/d(t)]}
=d(t)cos [ωt+n(t)/d(t)]

$$\left.\begin{array}{l} m(t)<<1 \rightarrow \sin m(t) \sim m(t) \\ m(t)<<1 \rightarrow \cos m(t) \sim 1 \end{array}\right\} \rightarrow \cos \omega t - m(t) \sin \omega t \sim \cos \omega t \cos m(t) + \sin \omega t \sin m(t) = \cos[\omega t + m(t)]$$

SYSTEM AND METHOD FOR DIVISOR THRESHOLD CONTROL IN A MODULATION DOMAIN DIVIDER

CROSS-REFERENCE TO RELATED APPLICATIONS

The present application is a continuation-in-part of U.S. patent application Ser. No. 10/328,304, entitled "SYSTEM AND METHOD FOR DESIGNING AND USING ANALOG CIRCUITS OPERATING IN THE MODULATION DOMAIN," filed Dec. 23, 2002, the disclosure of which is hereby incorporated herein by reference.

TECHNICAL FIELD

This invention relates to analog computation circuits and more particularly to systems and methods for a divisor threshold circuit for a modulation domain divider.

BACKGROUND

A limitation that any computational device has is that division by zero is undefined. In the specific case of a modulation domain divider, as discussed in above-identified U.S. patent application Ser. No. 10/328,304, operation is impaired not only for a divisor of zero, but also for a small divisor below the minimum design value for the divisor (referred to as the "divisor threshold").

The modulation domain divider, as discussed above is directed to a system and method for performing analog division in the modulation domain and, as discussed, has an undefined output when the divisor is below the divisor threshold. In one embodiment, a sine wave carrier is amplitude modulated by one of the input signals and a cosine wave carrier is amplitude modulated by the other of the input signals. These amplitude modulated signals are added together in a modified Armstrong modulator configuration, with the result being an amplitude and phase modulated signal having a phase modulation index proportional to the ratio of the amplitudes of the first and the second input signals. After removing the amplitude modulation with a limiter, this signal is then phase demodulated. The resulting baseband signal is proportional to the ratio of the first to the second signals. In essence then the Armstrong modulator is modified to enable the divisor signal to maintain inverse proportional control of the modulation gain of the Armstrong phase modulator, by varying the carrier injection level.

DISCUSSION OF PRIOR ART CIRCUITS

A commonly used circuit and method to perform the division using logarithms is shown in FIG. 8. This circuit is based on the mathematical property that the logarithm of a quotient is equal to the difference of the logarithms of the dividend and divisor.

As shown in FIG. 8, input signals n(t) and d(t) to circuit 80 are conditioned by passing each of them through logarithm function blocks 801 and 802 respectively. The logarithms of the input signals are subtracted by block 803 and the result is sent to antilogarithm (exponentiation) block 804. The accuracy of nonlinear circuit 80 depends upon how accurately the logarithmic (801, 802) and antilogarithmic (804) functions are realized. If the signals involved have wide dynamic range, then the transistors within the calculation blocks must operate over a wide range of currents. This increases the difficulty of achieving accurate nonlinear functions. Also, when the current is small, bandwidth tends to suffer. The design equations for this type of circuit are all highly temperature dependent, making drift a problem. It is also difficult to obtain a low noise floor using analog circuits as described.

Another commonly used circuit and method is to use a multiplier, such as multiplier 902, in a feedback path of a servo loop, as shown in FIG. 9 circuit 90. This has the effect of using a multiplier to obtain division when its output is fed into subtractor 901. Such a circuit is an inverse multiplier analog divider. Multiplier 902 is commonly constructed as a Gilbert multiplier. There are two main practical difficulties with this circuit. First the divider accuracy can be no better than the accuracy of the multiplier. Although a Gilbert multiplier is somewhat easier to build than the logarithmic circuits of FIG. 9, it still has problems with linearity, dynamic range, and noise. Second, the accuracy of the circuit is also affected by errors in the servo loop. Impairments in servo amplifier 903 can cause loop tracking errors, denoted $\epsilon$ in FIG. 9. Also, the loop gain varies depending on the characteristics of the signals being divided. This makes loop design difficult and loop dynamics unpredictable.

FIG. 10 shows Armstrong phase modulator 1000 where sine wave carrier generator 1001 drives multiplier 1003 via amplifier 1005 (gain=−1) which is being used as a double side band suppressed carrier (DSB-SC) (balanced) modulator. A DSB-SC signal is the same as a conventional amplitude modulation signal, except that the carrier is suppressed. Modulation input port 1010 drives the other input of multiplier 1003. The output of multiplier 1003 is a DSB-SC signal. The DSB-SC signal drives one input of adder 1004. The other input to the adder is the carrier signal shifted 90° by shifter 1002. Output 1011 of adder 1004 is a phase-modulated signal. The modulation index is proportional to the ratio of the amplitude of the DSB-SC signal to the injected carrier amplitude. Modulation index is defined as the peak phase deviation in radians.

For proper operation, the maximum modulation index must be within the "small angle approximation" regime, where phase modulation can be considered a linear process. This is also known as narrow band phase modulation (NBPM). In general, phase modulation (a member of the angle modulation family) is a non-linear process. The modulation index limit for NBPM is approximately 0.5, depending on the amount of modulation error that can be tolerated. For example, if the modulation index is limited to 0.45, then the harmonic distortion for tone modulation is less than 5%.

BRIEF SUMMARY

In accordance with the invention, a modulation domain divider is disclosed that causes the divider output to be attenuated when the divisor input falls below the divisor threshold. Attenuation is accomplished by implementing the divider in the modulation domain and substituting an unmodulated signal for the normal modulated signal when the divisor is below the threshold value. In systems when a long run of data occurs without data transitions it is desirable to essentially "mute" the phase output by reducing it to near zero.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
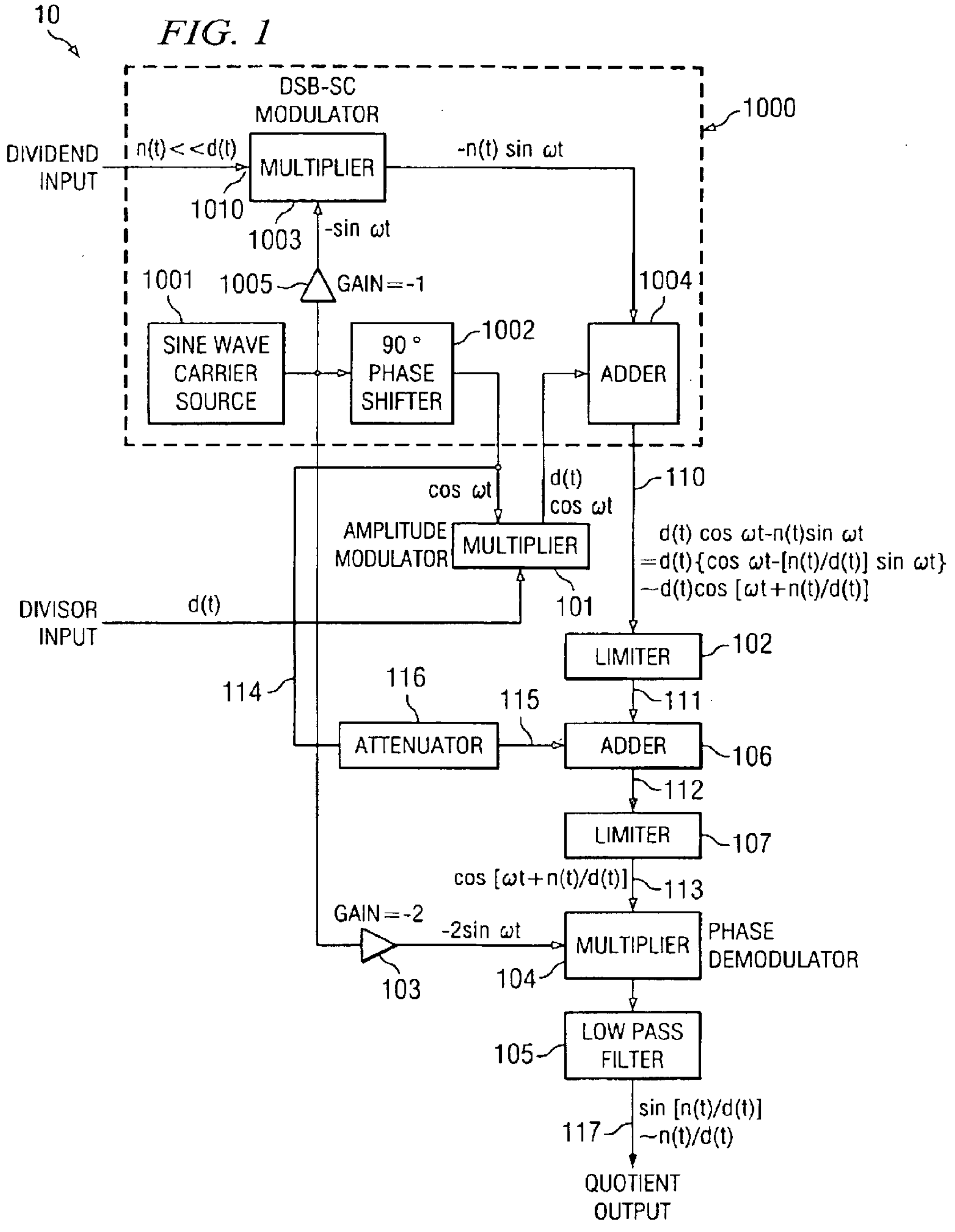
FIG. 1 shows one embodiment in accordance with the invention of a modulation domain analog divider having a divisor threshold.
Figure 10:
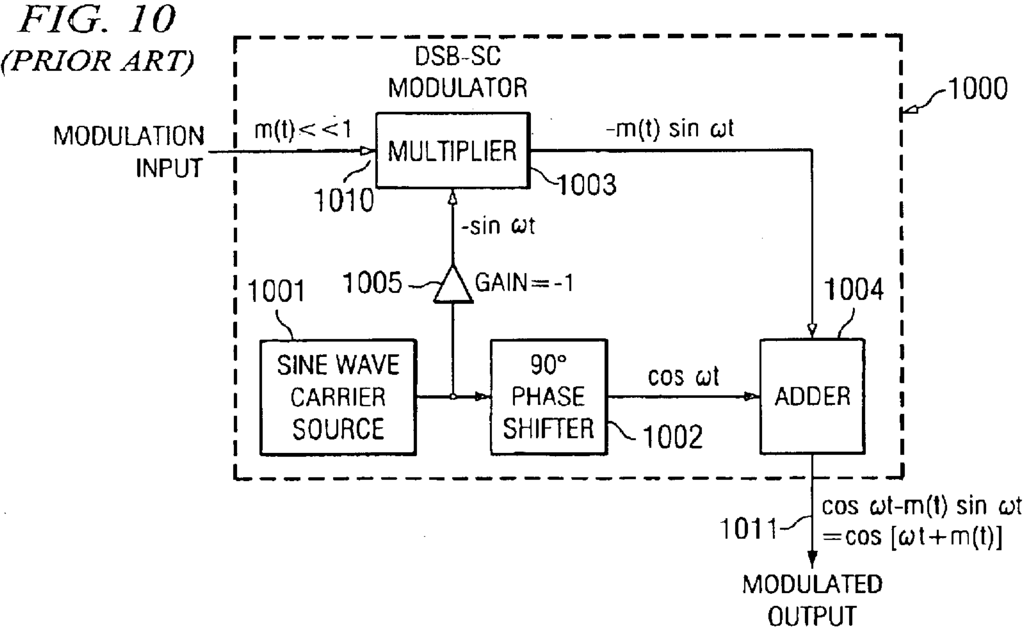
FIG. 10 (PRIOR ART)
FIG. 10 shows a prior art Armstrong phase modulator.

Circuit 10, shown in FIG. 1, shows one embodiment in accordance with the invention in which an Armstrong phase modulator, such as Armstrong phase modulator 1000 (shown in FIG. 10 and discussed above), is modified so as to break out the carrier injection path between 90° phase shifter 1002 and adder 1004. An amplitude modulator, for example, multiplier 101, is inserted in this path. Divisor signal d(t) drives the modulation port of multiplier 101. Multiplier 101 controls the amount of carrier signal injected into adder 1004. Meanwhile, dividend input signal n(t) drives modulation port 1010 of the DSB-SC modulator. The DSB-SC carrier signal out of the DSB-SC modulator (as discussed above) is combined in adder 1004 with the injected amplitude modulated carrier signal from multiplier 101, to produce a phase-modulated signal at output 110 of the modified Armstrong phase modulator. The phase modulation index of this signal is proportional to the ratio of the dividend signal to the divisor signal. Thus, a division of the dividend signal by the divisor signal has taken place in the modulation domain.

Figure 6A:
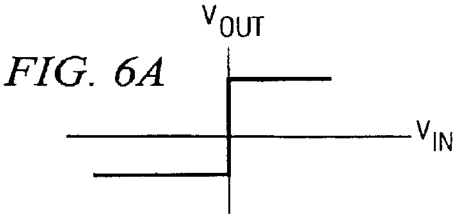
FIGS. 6A, 6B, and 6C show limiter characteristics in accordance with the invention.

The signal at the output of the modified Armstrong phase modulator is also amplitude modulated by the divisor signal. This is unlike a normally operating conventional Armstrong phase modulator, which has no amplitude modulation of the output. Limiter 102 strips off this incidental amplitude modulation without affecting the phase modulation. If a divider without the divisor threshold capability were being implemented, then an ideal signum (sgn(x)) function limiter characteristic, shown in FIG. 6A, (also known as a zero-crossing detector), would be appropriate for limiter 102. However, in order to implement the divisor threshold function, limiter 102 needs to have the characteristic of limiting (clipping) only when the divisor is above the threshold. For example, the linear-below-clipping limiter characteristic shown in FIG. 6B would be acceptable because it is linear at low levels and has a constant amplitude at high levels. An alternate embodiment would be the exponential-below-clipping limiter characteristic shown in FIG. 6C. This results in a signal which is exponential at low levels and has a constant amplitude at high levels. It is to be understood that limiters with other characteristics may also be usable.

Figure 7A:
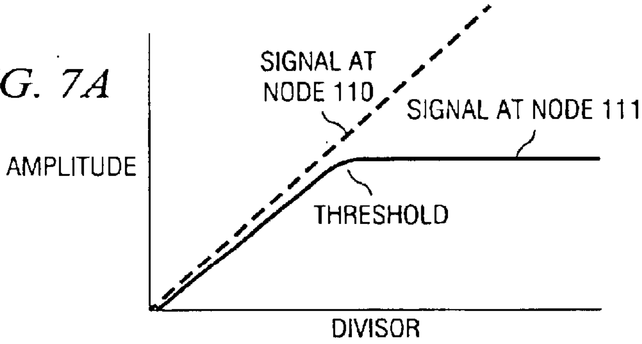
FIG. 7A shows the signal at nodes 110 and 111 versus divisor value.

FIG. 7A shows a graph of the signal at node 111 for the case where limiter 102 has a linear-below-clipping characteristic. The amplitude on node 110 at the input of limiter 102 is always proportional to the divisor, whereas the output of limiter 102 on node 111 is proportional to the divisor below threshold and constant above the threshold. The phase modulation at the output of limiter 102 is the same as at the input.

Continuing in FIG. 1, the carrier signal utilized in Armstrong modulator 1000 is supplied to node 114 and attenuated by attenuator 116 resulting in an attenuated carrier signal at node 115. The attenuation is set such that, when the divisor is above the threshold, the amplitude of the signal at node 115 is the same as the amplitude of the signal at node 111. Also, the phase is adjusted as necessary to make the phase of the signal at node 115 the same as node 111. One embodiment for setting the attenuation and phase of attenuator 116 is shown and discussed with respect to vector modulator 316 shown in FIG. 3. The signal at node 115 will be referred to as the unmodulated substitute carrier signal.

Adder 106 adds the unmodulated substitute carrier signal at node 115 to the modulated signal at node 111. The operation of adder 106 is based on the "capture effect," and in conjunction with attenuator 116 provides phase attenuation based on the amplitudes of the respective signals. The principle of the capture effect is that when two phase modulated signals are linearly added, the phase modulation of the sum will be dominated by the phase modulation of the stronger of the two input signals, if the amplitudes differ by at least several dB. When the divisor is such that the amplitude of the signal at node 111 (which signal is proportional to the divisor at that point) falls below the threshold, the unmodulated signal on node 115 "captures" the output of adder 106 which essentially has an attenuation effect on the signal on node 112. As the divisor approaches zero (i.e., the signal on node 111 approaches zero), the phase modulation on the signal on node 112 approaches the phase modulation of the signal on node 115. Since the signal on node 115 in the embodiment shown in FIG. 1 is unmodulated, the signal on node 115 becomes increasingly unmodulated and, thus, the phase modulation approaches zero as the divisor approaches zero. When the divisor is such that the amplitude of the signal at node 111 is above the threshold, the unmodulated substitute carrier signal at node 115 combines constructively with the modulated signal at node 111 resulting in a carrier at node 112 with twice the amplitude of the constituent signals. Since the sidebands at node 112 are the same amplitude as the sidebands at node 111, the modulation index is halved. This scale factor of two is easily compensated for downstream.

In a situation where it is desired to have the output signal approach a fixed non-zero value as the divisor approaches zero, the signal on node 115 would then be modulated, perhaps by a modulator (not shown), inserted, for example, between node 114 and attenuator 116. The value of the modulation would determine the fixed non-zero value.

Figure 7B:
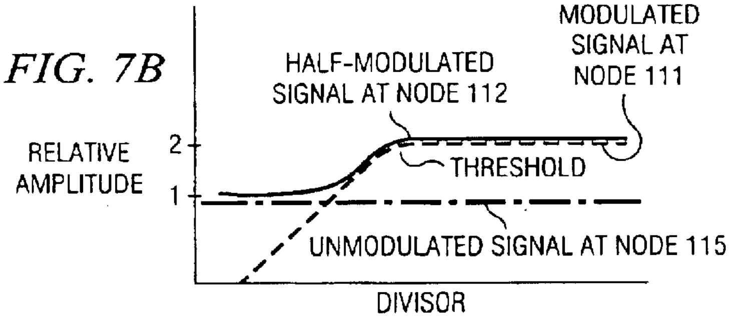
FIG. 7B shows the signal at nodes 111 and 112 versus divisor value.
Figure 8:
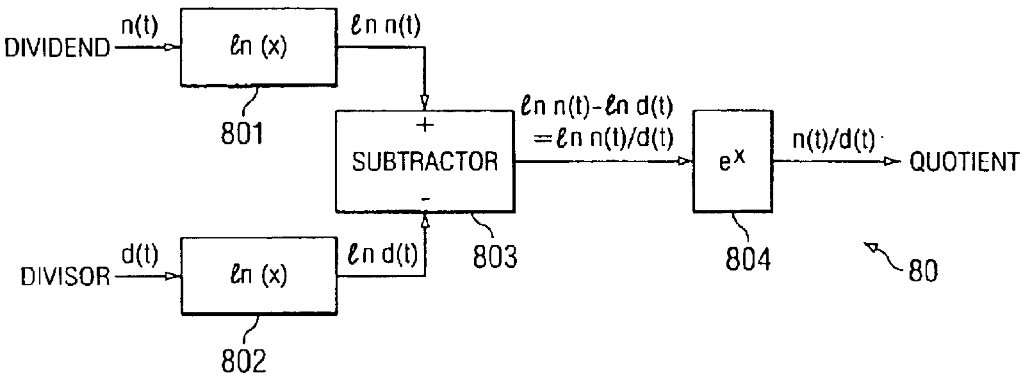
FIG. 8 (PRIOR ART)
FIG. 8 shows a prior art logarithmic analog divider.
Figure 9:
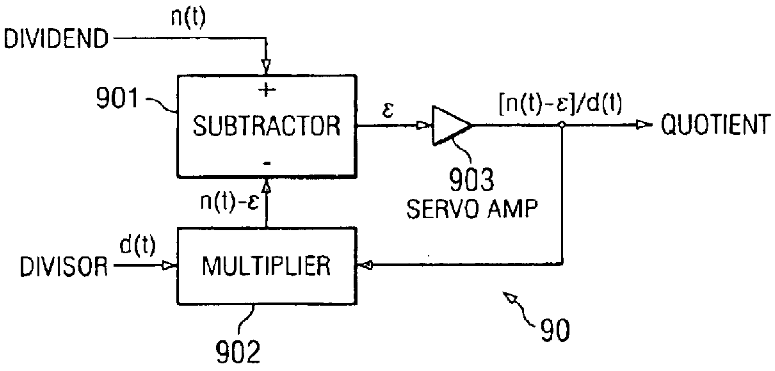
FIG. 9 (PRIOR ART)
FIG. 9 shows a prior art inverse multiplier analog divider.

FIG. 7B shows the signal at node 112 when the signal from limiter 102 is added to the signal from attenuator 116. The signal at node 112 is approximately unmodulated below the threshold and half modulated above the threshold. There is a 2:1 variation in amplitude at node 112.

As shown in FIG. 1, limiter 107 removes the undesirable 2:1 variation in amplitude of the signal at node 112, producing a constant amplitude signal at node 113. Unlike limiter 102, limiter 107 does not need to have any special characteristics; it merely needs to limit over the full 2:1 input range. The phase modulation on the output signal of limiter 107 (node 113) is identical to the phase modulation at its input (node 112); only the amplitude modulation has been removed. The signal at node 113 contains the desired modified quotient signal, but that signal is in the modulation domain. Mulitplier 104 and low pass filter 105 act as a phase demodulator and convert the signal from the modulation domain to the time domain, (i.e., baseband).

Figure 5A:
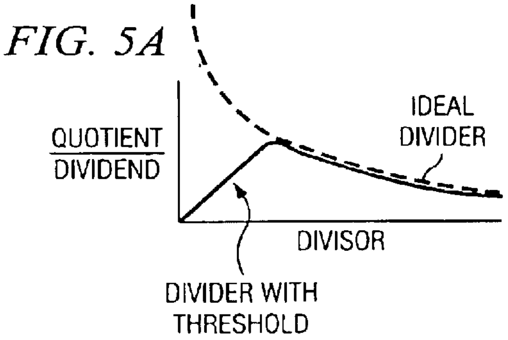
FIG. 5A is a graph showing the characteristics of the divisor threshold for the case of a linear-below-clipping limiter.
Figure 5B:
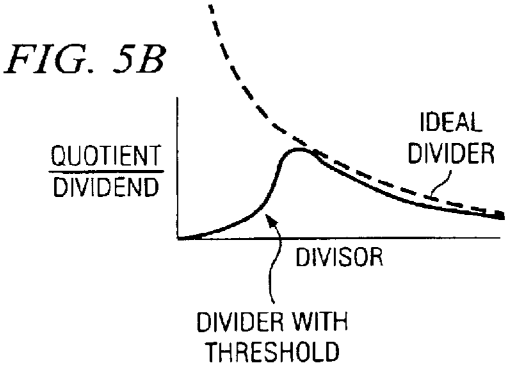
FIG. 5B is a graph showing a graph showing the characteristics of the divisor threshold for the case of an exponential-below-clipping limiter.
Figure 6B:
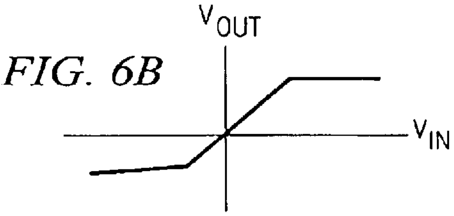
Figure 6C:
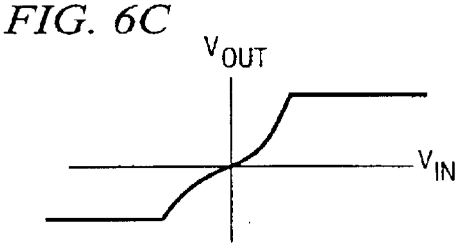

FIG. 5A shows the modified quotient output signal at node 117 (FIG. 1) versus divisor for the case of a linear-below-clipping limiter of the type described in FIG. 6B. FIG. 5B shows the modified quotient output signal at node 117 versus divisor for the case of an exponential-below-clipping limiter of the type described in FIG. 6C. These examples assume a constant dividend.

It should be understood that multipliers 1003, 101, and 104 are shown for illustrative purposes only and that the DSB-SC modulator, amplitude modulator, and phase demodulator can each be implemented in many ways other than as a multiplier. In an embodiment in accordance with the invention, this function would be implemented by frequency mixers, using switches and passive components. Further, it should be understood that there may be many implementations of the Armstrong modulator known to those skilled in the art, any of which can be used, assuming that they are amenable to the concepts discussed above. Also, amplitude modulation can be accomplished by voltage controlled attenuation or amplification, if desired. It should be understood that limiter 102 may not be necessary if the phase detector is either inherently insensitive to amplitude modulation or performs a limiting function in conjunction with demodulation. For example, if multiplier 104 were actually inherently insensitive to amplitude modulation, the circuit would not require limiter 102.

In circuit 10 the combination of the two multipliers (1003, 101) adder 1004, and 90° phase shifter 1002 constitute what is commonly referred to as an "I/Q modulator," which is a vector modulator with inputs in cartesian format. The axes are labeled "I" and "Q" meaning in-phase and quadrature.

Figure 2:
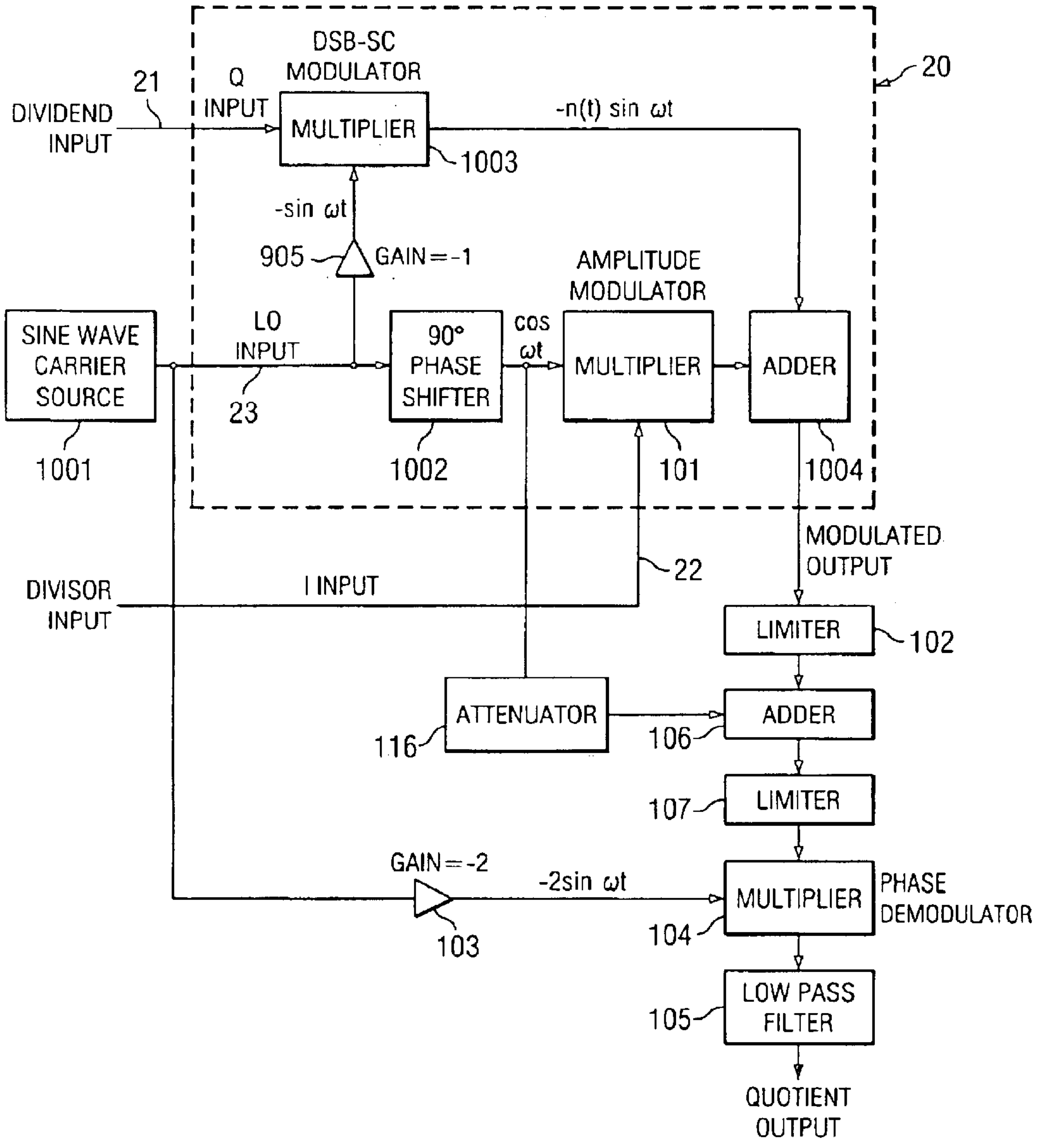
FIG. 2 shows an embodiment in accordance with the invention using an I/Q modulator.

FIG. 2 shows an alternate description of FIG. 1 showing I/Q modulator 20 in accordance with the invention, where the dividend input is sent to Q input 21 and the divisor input is sent to I input 22. The carrier source input goes to LO input 23. This circuit functions as discussed with respect to FIG. 1. Note that while not shown, the phase shifted signal could also be externally applied.

Figure 3:
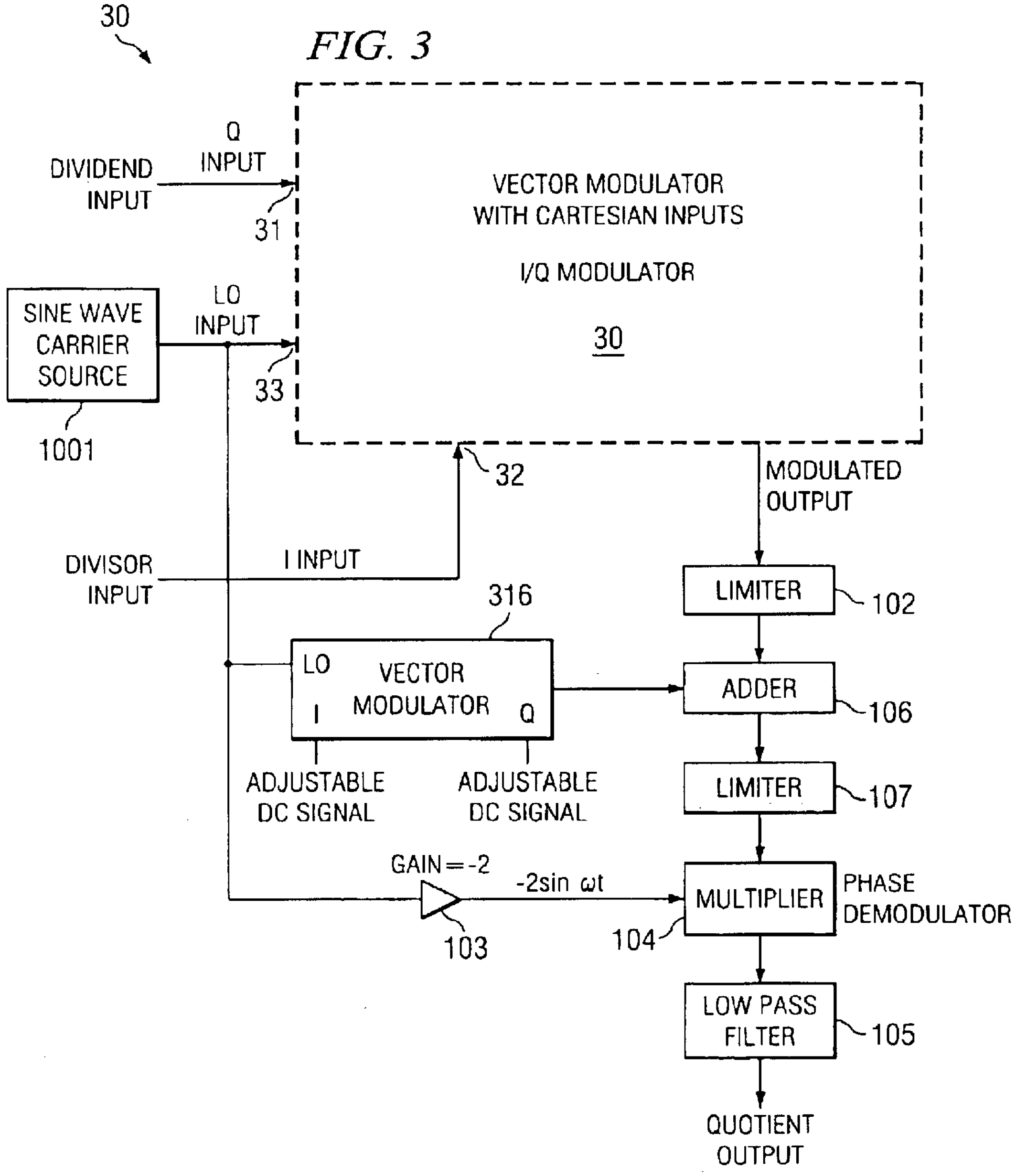
FIG. 3 shows an embodiment in accordance with the invention using a generic vector modulator with cartesian inputs.

FIG. 3 shows generic I/Q modulator 30 and the concepts discussed herein can be employed using implementations of any form of Cartesian vector modulation, regardless of how they are internally constructed. The dividend input is the Q input and goes to terminal 31 while the divisor input is the I input and goes to terminal 32. The carrier source input goes to LO terminal 33 and also to the LO input of vector modulator 316. The other inputs to vector modulator 316 are DC values that are used to set the desired amplitude and phase of the unmodulated substitute carrier input as it is applied to adder 106. It is to be understood that alternate embodiments could be used in place of vector modulator 316 to provide variable attenuation and/or variable phase shift. Again, this circuit functions as discussed above with respect to FIG. 1. Furthermore, the limiter/phase demodulator could have other implementations, not confined to the multiplier configuration shown. For example, a frequency discriminator followed by an integrator would work. Also, the I and Q inputs to the vector modulator can be interchanged, although this may require inserting a 90° phase shifter into the LO connection to the demodulator.

Figure 4A:
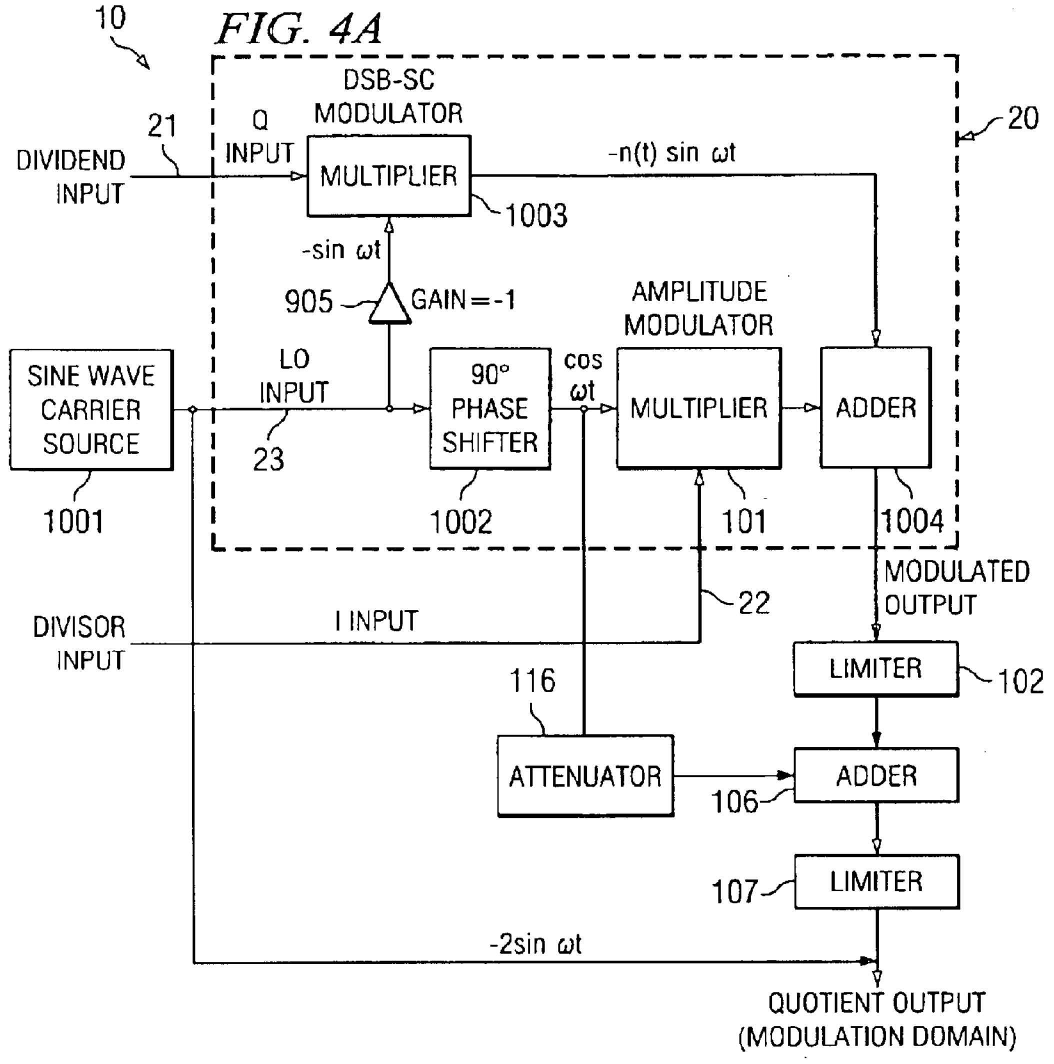
FIGS. 4A, 4B and 4C show circuit arrangements in accordance with the invention where the output or an input operates in the modulation domain.
Figure 4B:
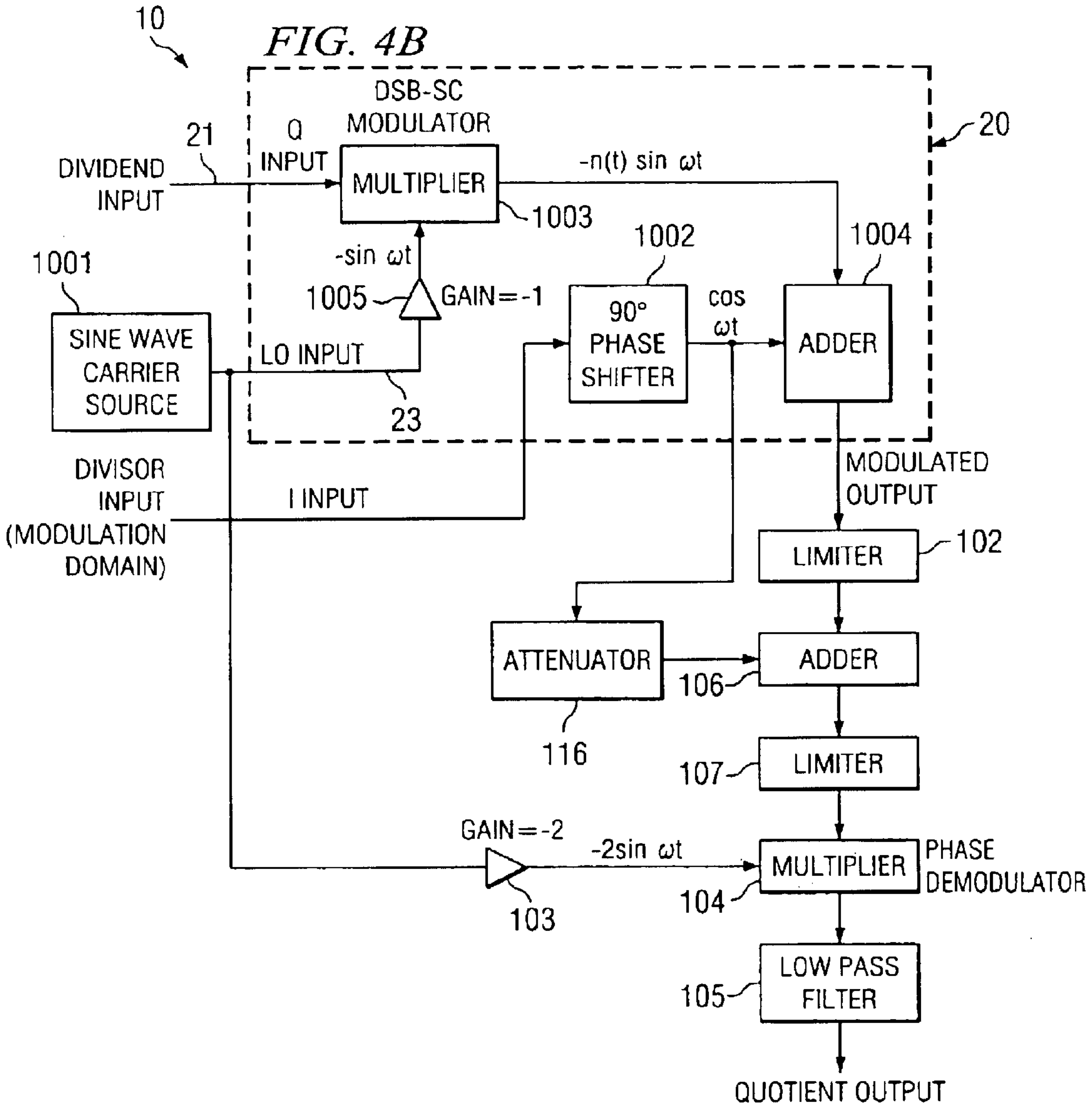
Figure 4C:
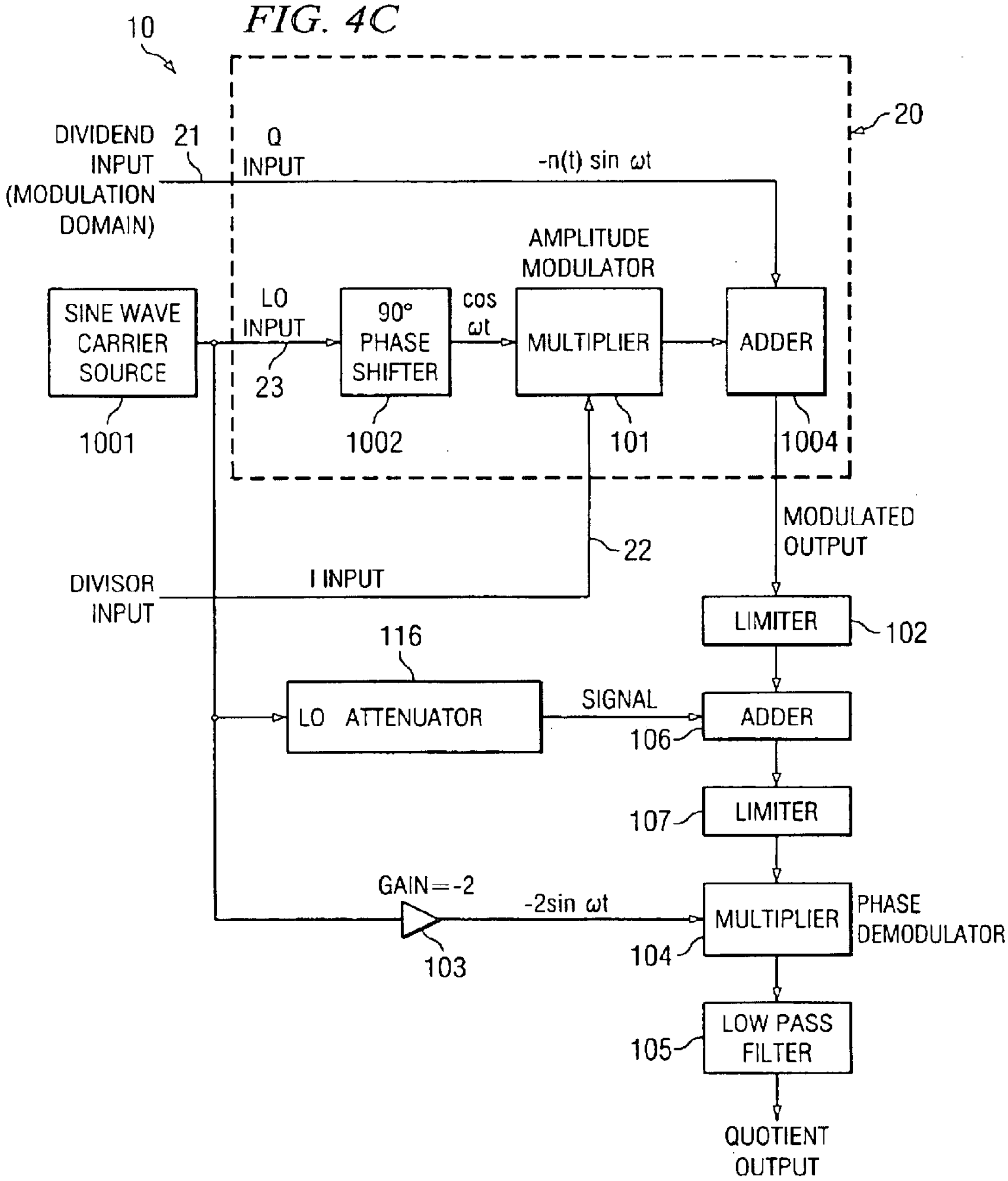

Although the discussion has focused on baseband input and output signals being processed in the modulation domain, it is to be understood that it is also possible to convert any or all ports to modulation domain ports as shown in FIG. 4A, where the quotient output is taken out in the phase modulation domain by by-passing the phase demodulator, e.g., multiplier 104 of FIG. 2. In FIG. 4B, the divisor input is taken in from the amplitude modulation domain by by-passing the amplitude modulator, e.g., multiplier 101 of FIG. 2, and inputting the divisor input (in the modulation domain) into a phase shifter, e.g., 90° phase shifter 1002. In FIG. 4C, the dividend input is taken in from the phase modulation domain, by-passing the multiplier, e.g., multiplier 1003 of FIG. 2, and using, for the carrier input to the adder, e.g. adder 1004, a sine wave that is phase modulated by the dividend signal.

A solution for the zero divisor problem is to add a constant offset to the divisor. The problem with this solution is that there is always an error in the division, even for large divisors. An analysis of the jitter measurement system shows that this error does not reduce to acceptable levels even for larger divisors. A constant could be added either by baseband summation before the divisor input to the vector modulator or, in the modulation domain, by dispensing with limiter 102 (FIG. 1).

Another solution for the zero divisor problem, is to have a comparator measure the value of the divisor and when this signal decreases to a value commensurate with default modem, the comparator would activate an output gate that blanks (i.e., mutes) the quotient output. This is difficult to implement.

One class of applications where a divisor threshold is useful are systems where data must be normalized by dividing a signal proportional to phase by some weighting factor. For example, in measuring jitter on non-return to zero (NRZ) data signals, many phase detectors have an output proportional to jitter. These detections also have the property of being weighted proportionally to data bit transition density. This weighting is a natural outgrowth of the fact that the phase detector can only measure phase when there is a change in the value of the data from 0 to 1 or from 1 to 0. In other words, the nature of the NRZ format is such that there is no timing information available when the data consists only of a long run of all 0's or all 1's.

It is desirable to remove this weighting by dividing the signal which is proportional to phase by a signal having a value proportional to transition density, but independent of phase. The effect of doing this operation with divisors less than 1 is to greatly amplify the output of the phase detector during periods of low transition density. This also amplifies any measurement errors the phase detector makes. For densities that are sufficiently low, a point is reached where the divider is virtually amplifying noise. For these densities, it makes sense to shut off the output and ignore the "measurements" being generated. A typical divisor threshold would be 0.1, representing a data pattern with 10% transition density (e.g., 0000000001111111111000000000001111111111 . . . ) and resulting in 20 dB of amplification compared to a divisor of 1, which represents a data pattern with 100% transitions, i.e., 010101010 . . . .

Extremely long runs occur infrequently in most practical data streams, thus there is negligible reduction in accuracy due to deleting jitter information during these occasional occurrences. Many jitter measurements are defined in terms of worst case peak to peak jitter measured over a relatively long period of time. Typically, it is better to ignore questionable data, rather than run the risk of getting an "outlying" data point that erroneously increases the measured peak to peak jitter.

Although the present invention and its advantages have been described in detail, it should be understood that various changes, substitutions and alterations can be made herein without departing from the invention as defined by the appended claims. Moreover, the present application is not intended to be limited to the particular embodiments of the process, machine, manufacture, composition of matter, means, methods and steps described in the specification. As one will readily appreciate from the disclosure processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A circuit for providing an output signal that is the ratio of two input signals, said circuit comprising:

a phase modulator for providing a quotient signal having a phase modulation index proportional to the ratio of a dividend input signal to a divisor input signal; and a phase attenuator for attenuating the phase modulation index of said quotient signal when said divisor is below a divisor threshold.

2. The circuit of claim 1 wherein said phase modulation index approaches zero as said divisor signal approaches zero.

3. The circuit of claim 1 wherein said phase attenuator comprises:

an adder for combining a substitute carrier signal with said quotient signal.

4. The circuit of claim 3 wherein said substitute carrier signal is an unmodulated signal.

5. The circuit of claim 3 wherein said phase modulation index is controlled by the modulation value of said substitute carrier signal when said divisor is below said divisor threshold.

6. The circuit of claim 3 further comprising:

a vector modulator having adjustable I and Q DC input signals, said vector modulator operable for controlling the phase and amplitude of said substitute carrier.

7. The circuit of claim 1 further comprising:

a phase demodulator for phase demodulating said quotient signal to provide an output signal as a baseband signal.

8. The circuit of claim 1 wherein said phase modulator is an Armstrong phase modulator modified to have its modulation sensitivity controllable.

9. The circuit of claim 1 wherein said quotient signal includes amplitude modulation and wherein said circuit further includes:

a limiter for removing any said amplitude modulation from said quotient signal.

10. The circuit of claim 1 wherein said phase attenuator comprises:

an adder for adding an unmodulated substitute carrier signal to said quotient signal; and a limiter inserted ahead of said adder.

11. The circuit of claim 10 wherein said limiter operates linearly for signals below said divisor threshold value and operates to clip signals above said divisor threshold value.

12. The circuit of claim 1 wherein said limiter operates exponentially for signals below said divisor threshold and operates to clip signals above said divisor threshold.

13. An Armstrong modulator having a dividend input and a divisor input and a carrier injection signal, said modulator comprising:

means for modifying the operation of said modulation so as to enable a signal on said divisor input to maintain inverse proportional control of the modulation gain of said modulator; and means for further modifying said operation of said modulation so as to control an output signal in accordance with an unmodulated substitute carrier signal when said signal on said divisor input is below a certain value.

14. The Armstrong modulator of claim 13 wherein said divisor input certain value is set, at least in part, by the amplitude of said unmodulated substitute carrier signal.

15. A method for providing a division function in the modulation domain, said method comprising:

modifying an Armstrong phase modulator to enable the divisor signal to maintain inverse proportional control of the modulation gain of said Armstrong phase modulator by varying the carrier injection signal level; and reducing said modulation gain when said divisor signal is below a preestablished divisor threshold.

16. The method of claim 15 wherein as the value of said divisor signal approaches zero, said modulator gain approaches zero.

17. The method of claim 15 wherein said reducing comprises:

injecting an unmodulated substitute carrier signal such that said divisor threshold is set by the amplitude of said injected unmodulated substitute carrier signal.

18. A circuit for dividing a first analog signal by a second analog signal, said circuit comprising:

a double side band suppressed carrier modulator for accepting said first analog signal and for accepting a sine wave carrier signal;

an amplitude modulator for accepting said second analog signal and for accepting a phase shifted carrier signal;

a first adder for combining the outputs of said double side band suppressed carrier modulator and said amplitude modulator;

a first limiter for removing at least a portion of the amplitude modulation of the signal output from said first adder;

a second adder for combining the output of said first limiter with an unmodulated substitute carrier signal; and a phase demodulator for accepting said carrier signal and for accepting the output of said second adder, said phase demodulator providing, as an output, a signal which is either said first signal divided by said second signal when said divisor is above a divisor threshold value or an attenuated version of the signal consisting of said first signal divided by said second signal when said divisor is below said divisor threshold value.

19. The circuit of claim 18 wherein said attenuated version of said signal approaches zero as said second signal approaches zero.

20. The circuit of claim 18 wherein said attenuated signal is controlled, at least in part, by an unmodulated carrier injection signal.

21. The circuit of claim 18 wherein at least one of said double side-band suppressed carrier modulator, said amplitude modulator and said phase modulator is a multiplier circuit.

22. The circuit of claim 18 further including:

a second limiter for accepting the output from said second adder prior to said output being supplied to said phase modulator.

23. A method of processing a pair of input signals, said method comprising:

adding together a first signal comprised of a first one of said input signals modulated by a sine wave carrier and a second signal comprised of said second one of said input signals modulated by a cosine wave carrier;

comparing the output of said added together signals with an unmodulated signal having a magnitude equal to the magnitude of said added together signals when the second signal is at a predetermined threshold value, and a phase equal to said added together signals, so as to provide said output if said added together signals when said second signal is above said threshold value and to provide a signal with attenuated modulation when said second signal is below said threshold value; and phase demodulating the output of either of said provided signals.

24. The method of claim 23 further comprising:

limiting the amplitude modulation after said adding step.

25. The method of claim 23 further comprising:

limiting the output after said comparing.

26. A method of processing a pair of input signals, said method comprising:

modulating a carrier signal by a first one of said input signals;

modulating a phase shifted carrier signal by a second one of said input signals;

adding together said first and second modulated signals;

combining together an amplitude limited output signal from said added together first and second modulated signals with an unmodulated carrier signal to provide said amplitude limited output signal when the amplitude of said unmodulated carrier signal is equal to or less than the amplitude of said amplitude limited output signal and to provide an output signal with reduced modulation when the amplitude of said unmodulated carrier signal is greater than the amplitude of said amplitude limited output signal; and phase demodulating the output of said combining step.

27. The method of claim 26 wherein said default output signal is controlled by the phase of said unmodulated carrier signal.

28. The method of claim 26 further comprising:

clipping the amplitude of the signal from said added together first and second modulated signals when the amplitude of said unmodulated carrier signal is greater than the amplitude of said signal from said added together first and second modulated signals.

29. A circuit for processing input signals; said circuit comprising:

a first multiplier having one input for accepting one of said input signals and a second input for accepting a sine wave carrier signal;

a second multiplier having one input for accepting a second one of said input signals and a second input for accepting a signal that has been phase shifted from said sine wave carrier;

a first adder for adding the outputs of said multipliers to provide an added output signal;

a limiter for removing amplitude modulation from said added output signal;

a second adder for adding the output of said limiter with an unmodulated carrier signal derived by attenuating said signal that has been phase shifted from said sine wave carrier, said adder operating such that the modulation on its output signal is attenuated when the amplitude of said unmodulated carrier signal is greater than the amplitude of said limiter output signal, and its output signal has the same phase as said limiter output signal when the amplitude of said unmodulated carrier signal is less than the amplitude of said limiter output signal; and a third multiplier having one input for accepting said second adder output signal, a second input for accepting said sine wave carrier signal so as to provide an output signal that is the quotient of said first signal divided by said second signal when the amplitude of said unmodulated substitute carrier signal is greater than the amplitude of said limiter output signal.

30. The circuit of claim 29 further comprising:

a limiter for stripping off at least a portion of the amplitude modulation of the output from said second adder prior to said signal being presented to said third modulator.

31. A method of processing a pair of input signals, said method comprising:

modulating a carrier signal by a first one of said input signals;

phase shifting a modulation domain second input signal;

adding together said first input modulated signal and said phase shifted second input signal to provide a quotient output signal as a modulated output signal; and at least partially replacing said quotient output signal with an unmodulated signal when said second input signal is less than a certain value.

32. The method of claim 31 further comprising:

fully replacing said quotient signal with said unmodulated signal when said second input signal is zero.

33. The method of claim 31 further comprising:

setting said certain value by adjusting the magnitude of said unmodulated signal.

* * * * *